(12) United States Patent
Csonka et al.

(10) Patent No.: US 7,269,028 B2
(45) Date of Patent: Sep. 11, 2007

(54) TRACE-PAD INTERFACE FOR IMPROVED SIGNAL QUALITY

(75) Inventors: Jacqueline V. Csonka, Don Mills (CA); Ignatius T. Chong, Ajax (CA)

(73) Assignee: Celestica, Inc., North York (CA)

( * ) Notice: Subject to any disclaimer, the term of this patent is extended or adjusted under 35 U.S.C. 154(b) by 1048 days.

(21) Appl. No.: 09/739,252

(22) Filed: Dec. 19, 2000

(65) Prior Publication Data

US 2002/0134576 A1 Sep. 26, 2002

Related U.S. Application Data (63) Continuation of application No. 08/951,556, filed on Oct. 16, 1997, now abandoned.

(51) Int. Cl.
*H05K 7/06* (2006.01)
(52) U.S. Cl. .................... 361/777; 333/33; 333/34; 174/260; 174/261; 257/786
(58) Field of Classification Search .................. None
See application file for complete search history.

(56) References Cited

U.S. PATENT DOCUMENTS

| | | | | |
|---|---|---|---|---|
| 4,021,705 A | * | 5/1977 | Lichtblau | .................... 361/765 |
| 4,785,141 A | * | 11/1988 | Nishihara et al. | ........... 174/266 |
| 5,424,492 A | | 6/1995 | Petty et al. | .................. 174/250 |
| 5,444,187 A | * | 8/1995 | Bree et al. | .................. 174/260 |
| 5,530,623 A | * | 6/1996 | Sanwo et al. | ................ 361/788 |
| 5,541,565 A | * | 7/1996 | Dowsing et al. | .............. 333/34 |
| 6,008,538 A | * | 12/1999 | Akram et al. | ................ 257/723 |
| 6,091,155 A | * | 7/2000 | Jonaidi | ........................ 257/786 |

* cited by examiner

*Primary Examiner*—John B. Vigushin
(74) *Attorney, Agent, or Firm*—Brett J. Slaney; Blake, Cassels & Graydon LLP (57) ABSTRACT

A method of routing or laying out signal traces on printed wire or circuit board in order to improve signal transmission quality. The method includes routing a given signal trace such that it is electrically connected to a rectangular corner of a substantially wider component pin pad and forms an angle of approximately 135 degrees with the proximate sides of the pad, thereby minimizing the impedance discontinuity at the interface or junction of the signal trace and pad and hence minimizing the reflection of the digital signal at the interface or junction.

42 Claims, 6 Drawing Sheets

TRACE-PAD INTERFACE FOR IMPROVED SIGNAL QUALITY

This application is a continuation of U.S. patent application Ser. No. 08/951,556, filed Oct. 16, 1997, now abandoned which is incorporated herein by reference.

FIELD OF INVENTION

The invention relates generally to an interconnect structure for use in the construction of a printed circuit or wire board. More specifically, the invention relates to an improved interconnection interface between a relatively thin signal trace and a relatively wide component pad on the surface of a printed wire board in order to better accommodate high speed signals which are conducted along or through such an interface.

BACKGROUND OF INVENTION

Figure 1A:
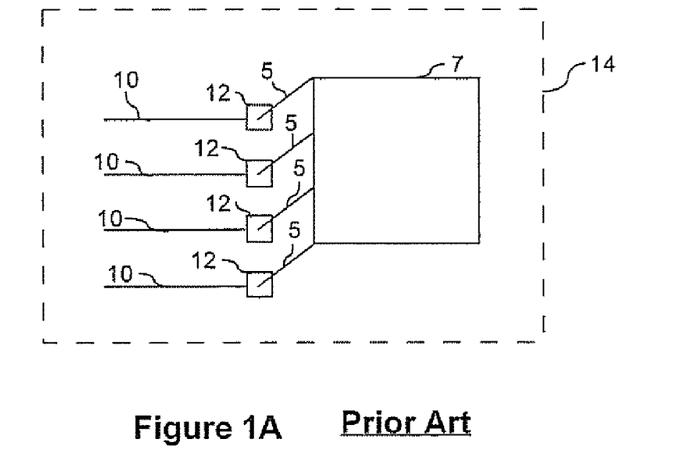
FIG. 1A is a schematic diagram of a component on a printed circuit board as is in the prior art.

Integrated circuit devices and other types of electronic components, such as componant 7 in FIG. 1A having multiple pinouts or leads 5 are often mounted onto the surface of a printed wire board 14 such that each pin or lead 5 of the electronic component 7 is mounted or soldered to a typically rectangularly-shaped deposit of copper (i.e. "pad12") present on the surface of the printed wire board 14. (The means for mounting electronic components directly onto the surface or a printed wiring board is commonly referred to as "surface mount technology".) The many component pads 12 which typically exist on the surface of the printed wiring board 14 are interconnected together in a predetermined configuration by thin copper signal lines (i.e. "traces10"). Conventionally, as is shown in FIG. 1, the practice in the industry has been to lay out a signal trace 10 so that it intersects one of the sides of the pad 12 at approximately the middle thereof. Typically too, the layout practice dictates that the trace 10 be orientated to intersect the side of the pad at a substantially ninety degree angle as shown.

Figure 1B:
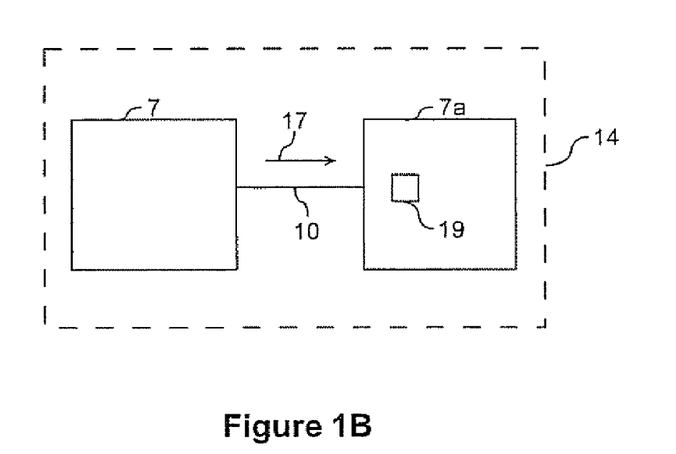
FIG. 1B is a block diagram of two components connected on a printed circuit board.
Figure 1C:
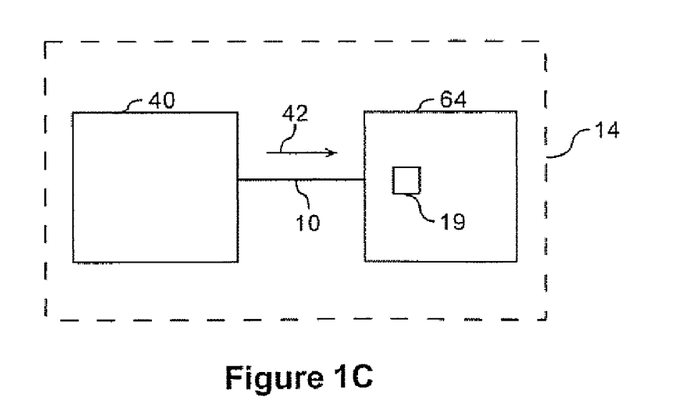
FIG. 1C is a block diagram of a memory controller and memory as an example of two components connected on a printed circuit board.

As Referring to FIG. 1B, as the internal operating speed of integrated circuits (IC's) such a microprocessors and memories increase with improving semiconductor process technology, the digital signals 17 which travel along the printed circuit board 14 between the various components 7 thereof also have to reach their destinations 7a, i.e. trigger their input receivers 19, more quickly in order to take advantage of the increased IC operating speed. For example, as shown in FIG. 1c, in order to decrease memory access time in a computer, the control signals 42 produced by a memory controller 40 must reach the memory 64 more quickly and at a greater frequency.

Figure 2A:
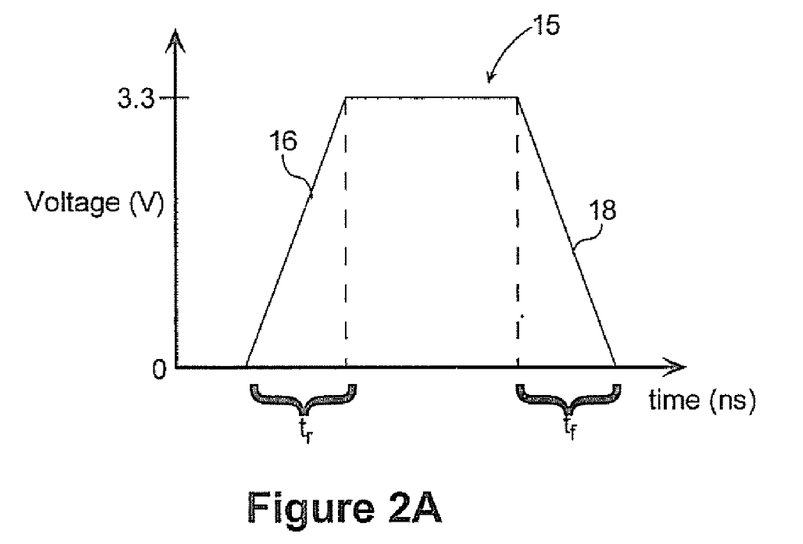
FIG. 2A is a diagram of a portion of a binary digital signal as represented in the time domain.

FIG. 2A shows a typical digital binary signal 15 which goes from a low, or binary 0, state to a high, or binary 1, state. Since the transition of the signal from the low state to the high state or vice versa cannot be accomplished instantaneously, there exists a rise time $t_r$ and a fall time $t_f$ which respectively results in a sloping leading edge 16 and a sloping trailing edge 18. In order to make a control signal reach or trigger an input receiver faster, it is necessary to (a) minimize the rise and/or fall time, and (b) increase the frequency at which control signals are sent. In the present art, the rise/fall time has fallen to below one nanosecond, with signal frequency at 66 MHz.

Figure 2B:
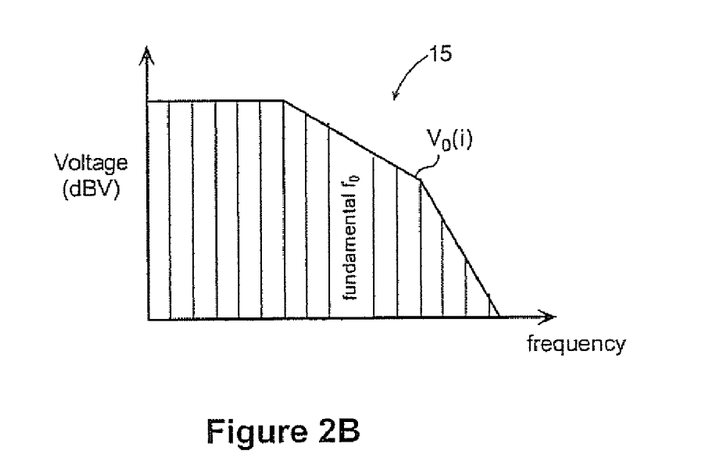
FIG. 2B is a diagram of the signal shown in FIG. 2A as represented in the frequency domain.

FIG. 2B shows the binary digital signal 15 represented in the frequency domain. It will be noted that each frequency component i of the digital signal has a voltage $v_0(i)$ associated therewith (phase information is not shown in FIG. 2B).

On a printed circuit board, the junction between a signal trace and a component pad, such as the prior art interface shown in FIG. 1, represents an impedance discontinuity since (a) the width of the conducting path suddenly drastically increases at the pad and (b) the cross-sectional area or thickness of the conducting path increases due to solder present on the pad. When a digital signal such as that shown in FIGS. 2A and 2B travels across an impedance discontinuity, the voltage or power of the signal is split at the trace/pad junction so that a portion $v_0(i)/x_1(i)$ of each frequency component i of the signal travels back in the opposite direction of the wave front. The remaining portion $v_0(i)/x_2(i)$ of each frequency component i of the signal travels in the original or forward direction. The values $x_1(i)$ and $x_2(i)$ are greater than or equal to one. The greater the ratio of the larger impedance to the smaller impedance at the discontinuity, the more the voltage of the signal components will be affected by the discontinuity, i.e., the smaller the value of $x_1(i)$.

Figure 3:
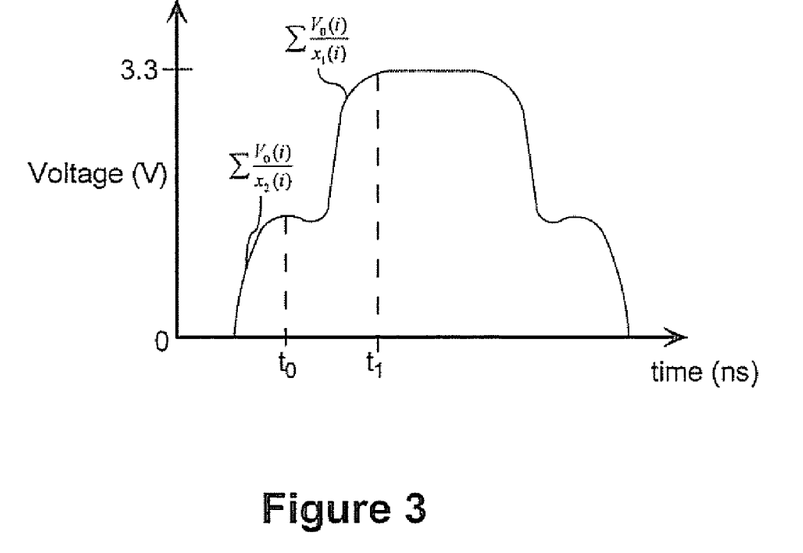
FIG. 3 is an idealized diagram of a portion of a noisy digital signal in the time domain which features multiple rising edges caused by an impedance discontinuity at the junction between a trace and a pad.

The portions $v_0(i)/x_1(i)$ of each frequency component of the signal which travel in the opposite direction will similarly reflect at the next impedance discontinuity in their path, and the same will happen to the frequency components $v_0(i)/x_2(i)$ which travel in the forward direction. The reflected portions of the signal will recombine with the wavefront and modify its appearance. In the frequency domain, this will be visible as a change in voltage associated with each frequency component. In the time domain, this will appear as one or more "glitches" or "inflection points". An example of one such glitch caused by a single discontinuity is shown in idealized form in the time domain diagram of FIG. 3 where at time/position $t_0$ the forward portion $\Sigma v_0(i)/x_2(i)$ of the signal travels across the impedance discontinuity presented by the prior art trace/pad junction and a short time $t_1$ later the reflected and rebounded portion $\Sigma v_0(i)/x_1(i)$ of the signal recombines.

The physical size of electronic components mounted on a printed circuit board means that the components have to be distributed across the board in such a way that relatively long signal traces cannot be avoided. Inflection points or glitches on the signal will be produced by the impedance discontinuities along the conduction path the signal travels. These non-monotonic wave forms appear as multiple rising (or falling) edges where only one rising (or falling) edge was desired. One or a combination of the glitches or inflection points may produce false triggers at input receivers. The invention seeks to reduce the tendency of this phenomenon.

SUMMARY OF INVENTION

In a broad sense, the invention provides an interconnect structure for connecting together a relatively narrow printed wire board signal trace and a substantially wider component pad in a manner which reduces the amount of signal reflection at the trace/pad junction. The reduced signal reflection thus reduces the tendency to produce false triggers at input receivers. This objective is accomplished by routing or laying out a given signal trace so that it is electrically connected to a corner of the substantially rectangularly shaped pad, such that a longitudinal centerline axis of the trace will form an angle in the range of 110 to 160 degrees, and preferably approximately 135 degrees, with a proximate side of the component pad. This topology results in a gradual increase in the width of the conducting path thereby reducing the impedance mismatch between the signal trace and the component pad. The above described signal layout practice provides the advantage of not adversely affecting the manufacture of a printed circuit board, particularly the process of reflow soldering, as explained in greater detail below.

According to one aspect of the invention, there is provided a method of improving the transmission quality of a digital signal on a printed wire board wherein the digital signal travels along a conduction path comprising a relatively narrow signal trace which interfaces with a substantially wider, substantially rectangularly shaped component pad having at least one corner. The method includes the step of electrically connecting the signal trace to the corner of the substantially rectangular pad such that a longitudinal centerline axis through the signal trace forms an angle of approximately 135 degrees to a proximate side of the component pad.

According to another aspect of the invention, there is provided a method for improving the signal transmission quality of a printed wire board comprising relatively narrow signal traces electrically connected to substantially wider component pads of substantially rectangular shape having at least one corner. The method comprises the step of routing or laying out the signal traces such that the longitudinal centerline axis through each such trace is respectively electrically connected to the corners of the substantially rectangular pads to form angles of approximately 135 degrees to proximate sides of the respective pads.

Other details of the invention will become more apparent from the following detailed description and drawings wherein like reference numerals depict like elements.

BRIEF DESCRIPTION OF DRAWINGS

FIG. 1 is a diagram illustrating a typical junction between a printed wire board signal trace and a component pad as conventionally laid out in the prior art;

DETAILED DESCRIPTION OF PREFERRED EMBODIMENTS

Figure 4:
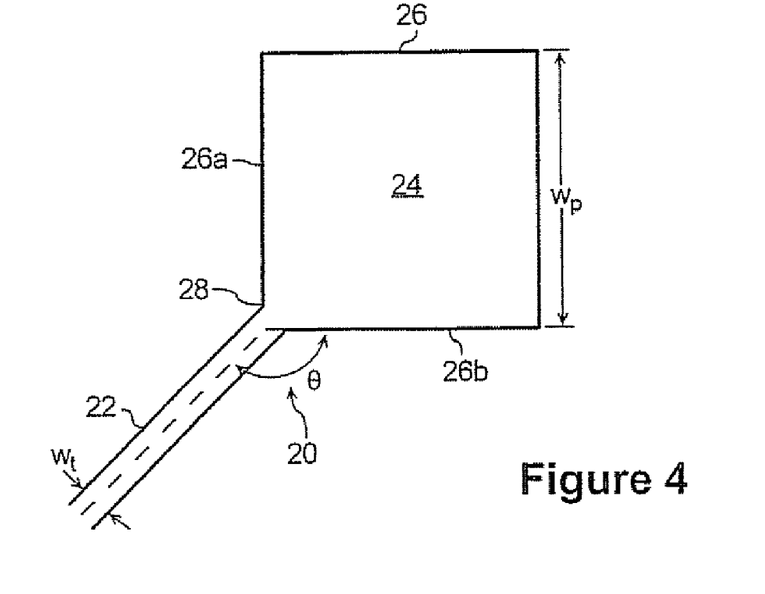
FIG. 4 is a diagram illustrating an interface between a printed wire board signal trace and a component pad in accordance with a preferred embodiment of the invention.
Figure 4A:
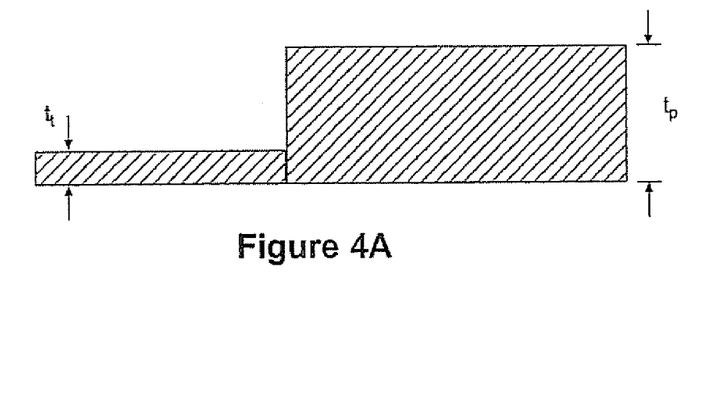
FIG. 4A is a schematic diagram of the interface of FIG. 4, shown in cross-section.

FIG. 4 illustrates an interconnect structure 20 for connecting together a relatively narrow printed wire board signal trace 22 and a substantially wider, substantially rectangular, component pad 24 in accordance with the preferred embodiment of the invention. The trace 22 has a width $w_t$ of about 4 mils (thousands of an inch) and pad 24 has a width $w_p$ of about 22 mils. The trace 22 has a cross-section or thickness $t_t$ of about 1.2 mils, and, due partially to the solder typically placed on the pad 24 for mounting the IC component pin, the pad 24 has a cross-section or thickness $t_p$ in the range of about 6 to 7 mils. These dimensions are typical of the present art. However, unlike the prior art, it will be noted that trace 22 is electrically connected to a corner 28 of substantially rectangular pad 24 and routed or laid out such that a longitudinal centerline axis of the trace 22 forms an angle θ in the range of about 110 to 160 degrees with proximate side 26b of the pad 24, with the most preferred angle θ being about 135 degrees.

Figure 5:
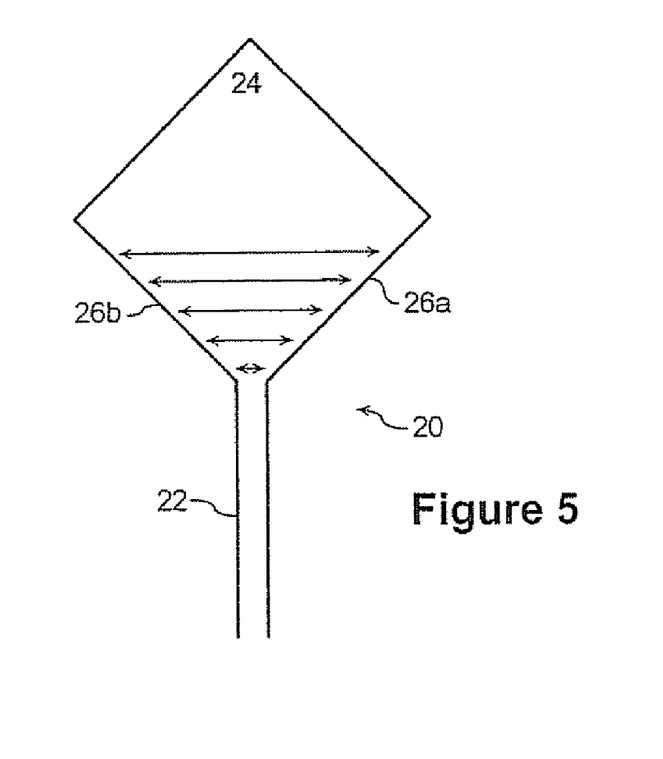
FIG. 5 is a diagram of the junction of FIG. 4 illustrating a gradually increasing conductive path width.

As illustrated in FIGS. 4 and 5, the topology of interconnect structure 20 permits a gradual increase in the width of the electrically conductive path between the signal trace 22 and component pin or lead (not shown). The gradual increase results in smaller impedance changes or graduations along the conductive path (as represented in FIG. 5) compared to the prior art interconnect structure topology shown in FIG. 1. Reflections will still occur, but since the reflection coefficient R at any given frequency ω is related to the ratio of the change in impedance Z at the boundary, i.e., $$R(\omega) = \frac{Z_2(\omega) - Z_1(\omega)}{Z_2(\omega) + Z_1(\omega)},$$

where $Z_1$ is the impedance at the near side of the boundary and $Z_2$ is the impedance at the far side of the boundary, the signal crossing from the near side to the far side of the boundary, the reflections will be smaller in amplitude as compared to the prior art trace/pad interface shown in FIG. 1.

The invention is preferably utilized in circumstances where the signal trace is sufficiently long so as to act like a transmission line. This is generally believed to occur when the length of the signal trace is approximately at least ⅙th of the "transition electrical length" of the digital signal, i.e., the rise or fall time of the signal multiplied by the propagation speed of the signal along the signal trace (which is typically about ½ the speed of light for FR4 type board). The invention is particularly useful when the length of the signal trace approaches or exceeds the transition electrical length of the digital signal since in such circumstances, assuming no other impedance discontinuities along the conduction path, reflections caused by the trace/pad interface have a greater likelihood of not recombining within the rise or fall time of the signal.

Figure 6:
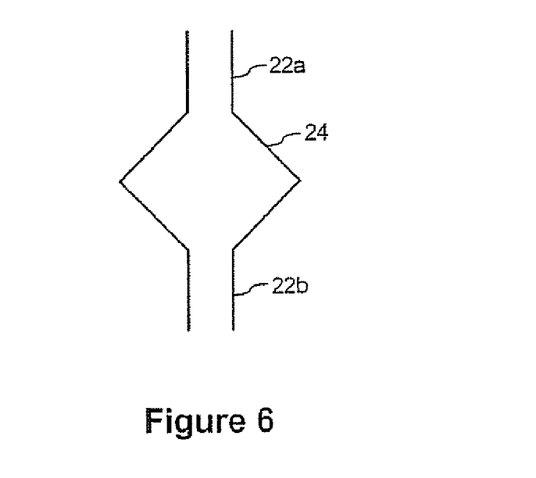
FIG. 6 is a diagram illustrating an interface between two signal traces and a component pad in accordance with a preferred embodiment of the invention.

When it is desired to couple two signal traces to a component pad, it is preferred to connect the signal traces 22 to opposite corners of the substantially rectangularly shaped component pad as shown in FIG. 6. This will ensure the most gradual impedance gradient in the event a digital signal has to flow from trace 22a, through the pad 24, to trace 22b.

It may also be thought desirable to gradually increase or flare the width of the signal traces as they approach component pads on printed wire boards in order to further reduce the impedance graduations along the conductor path. However, this approach leads to two particular disadvantages which are not conducive to the mass manufacture of printed circuit boards. One such disadvantage relates to the wire density of the printed wire board; flaring or widening the signal traces means that the board will accommodate a lower density of signal traces, which is contrary to the continuing trend towards ever greater miniaturization. Another disadvantage relates to the process by which printed circuit boards are assembled using surface mount technology assembly techniques. The assembly process generally includes a reflow soldering stage wherein electronic components are soldered en masse to their respective component pads on the printed wire board. Flaring the ends of the signal traces effectively results in increasing the mass of the component pads which will then not be able to accumulate enough heat in the conventional reflow soldering process to form a good joint with the associated component pins or leads. This condition is commonly termed a "cold solder joint" and results in printed circuit boards of poor signal transmission quality. In contrast, the preferred embodiment of the invention described above does not interfere with the conventional reflow soldering process nor is the wire or trace density of the printed wire board unduly compromised.

Figure 7:
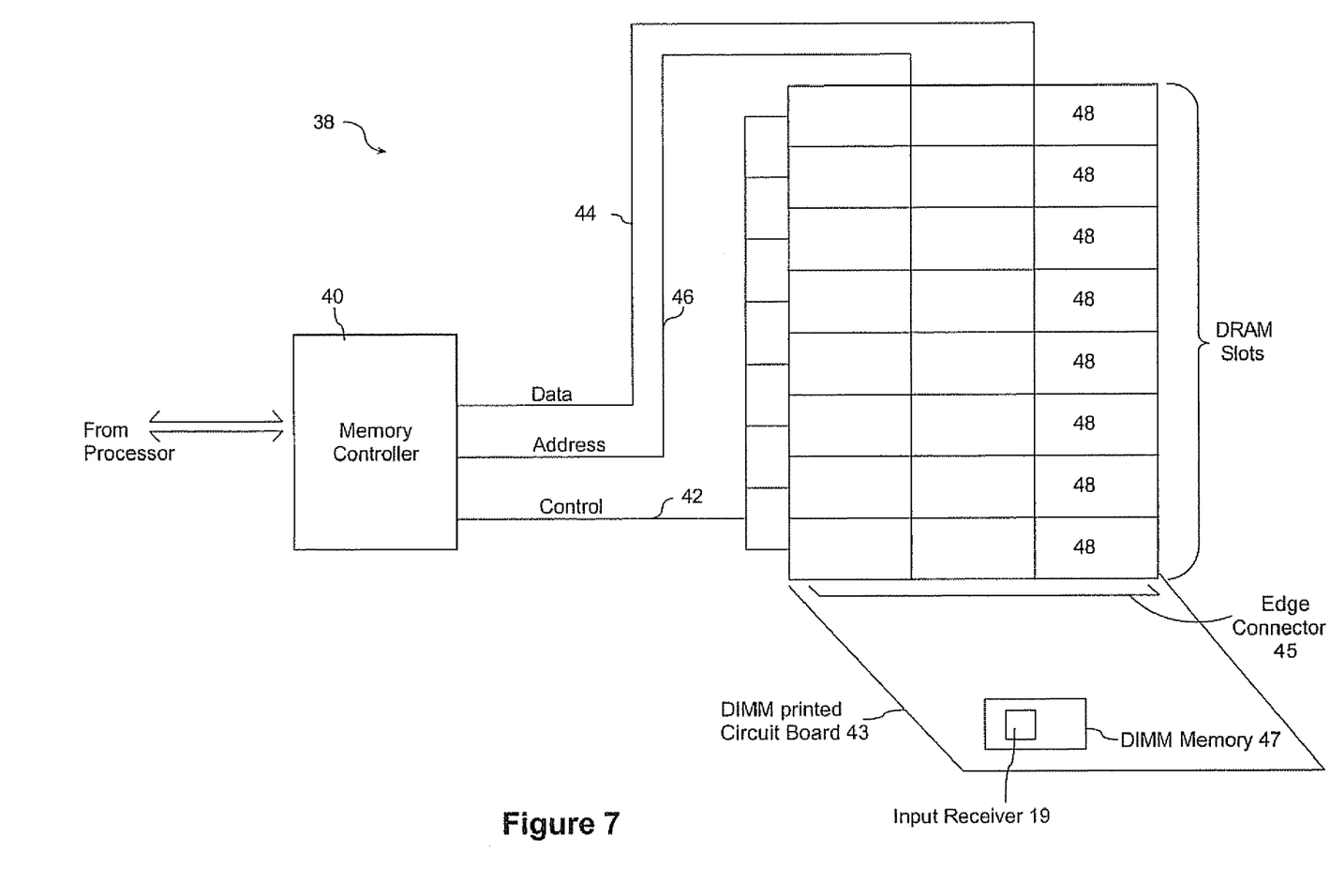
FIG. 7 is a block diagram of a memory system.
Figure 8:
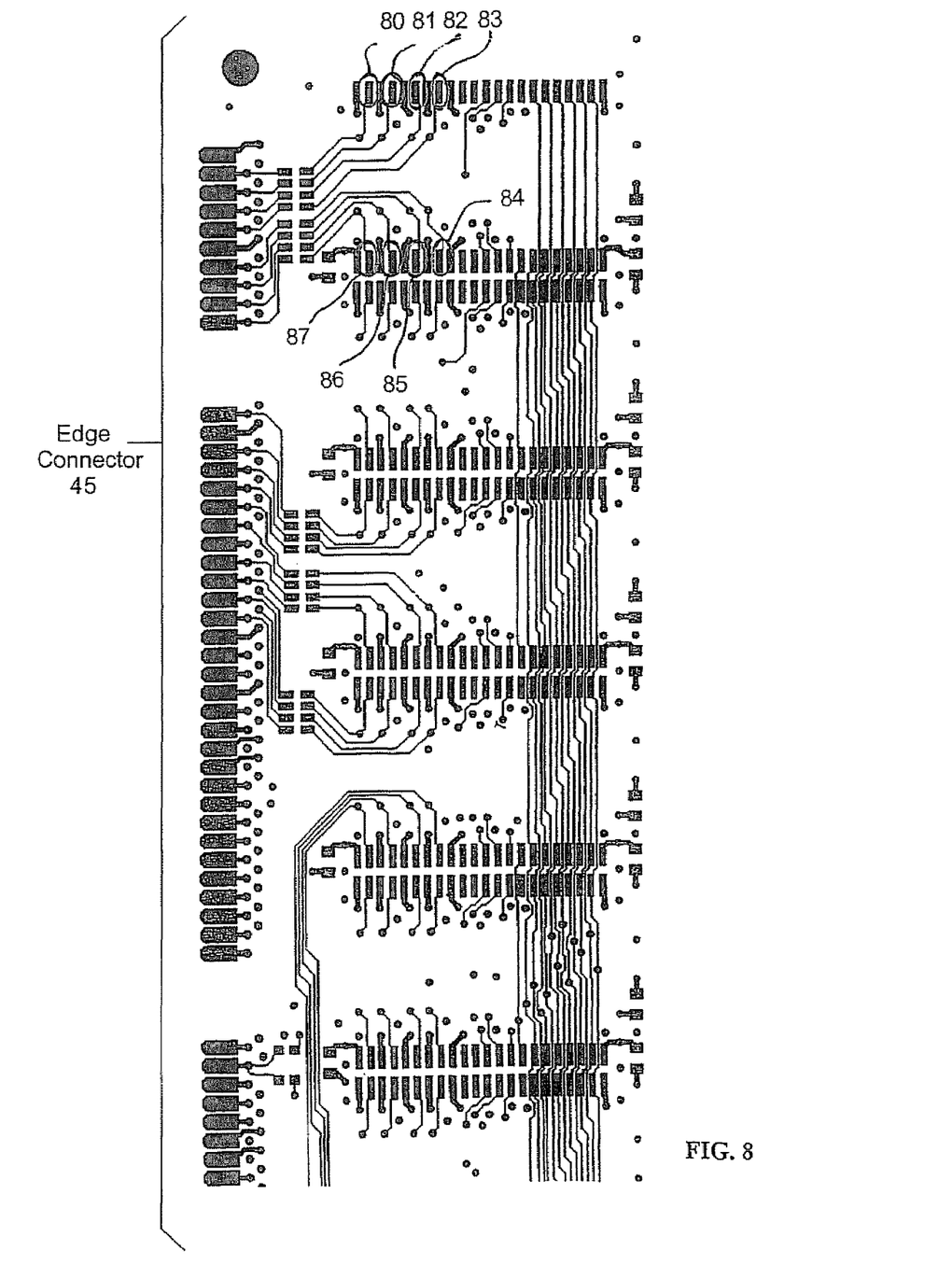
FIG. 8 is an illustration of one example of a portion of a mass produced printed wire board constructed in accordance with the principles of the invention.

The assignee of the instant application has developed a mass production printed circuit dual-in-line-memory-module (DIMM) utilizing the design layout principles of the invention. FIG. 7 shows a block diagram of a memory system 38 which employs the DIMM. The system 38 comprises a memory controller 40 which controls the flow of thirty three bit Control 42, seventy two bit Data 44, and twelve bit Address 46 signals to each of a plurality of DRAM DIMM slots 48. A processor, not shown, sends the Data 44 and Address 46 lines to the memory controller 40. Each of the DIMM slots 48 is a hardware connector into which DRAM DIMMs can be inserted. The system 38 is designed such that the controller 40 resides on one printed circuit board while the DRAM DIMMS reside on another circuit board 43. The DIMM printed circuit board 43 connects to slot 48 via an edge connector 45. The system 38 utilizes digital signals having a rise/fall time of below 1 nanosecond and the maximum frequency of the Control signals 42 is up to 66 MHz. Using a commercially available simulation software package ("simulator"), it was noted that the DIMM, as notionally assembled onto a conventionally laid out printed circuit board, occasionally exhibited errant behaviour due to false triggering of the DIMM memory 47. However, when the DIMM was modelled using a printed wire board 43 wherein certain signal traces 22 carrying critical control signals 42 were connected to the corners of the pads 24 at 135 degree angles as described above, the simulator showed that the preferred embodiment of the invention improved upon the errant behaviour of the originally modelled DIMM memory 47. FIG 8 shows an example of a portion of one surface of such a DIMM printed circuit board 43 which was constructed and mass produced.

Referring to FIG. 8, the edge connector 45 attaches the DIMM printed circuit board to the printed circuit board containing the memory controller. The DIMM memory components attach to the DIMM printed circuit board. As can be seen from FIG. 8, areas 80–87 have the connect structure of the pads with the traces as described in the invention and as shown in FIG. 4.

Those skilled in the art will appreciate that other modifications and variations may be made to the preferred embodiments disclosed herein whilst keeping within the spirit and scope of the invention as defined by the claims which follow:

What is claimed:

1. The apparatus for a signal-triggered digital circuit, said apparatus comprising:
   a signal source for generating a digital signal;
   an input receiver, said input receiver receiving said digital signal for said digital circuit and being responsive to triggering induced by said digital signal;
   a conducting interface;
   a conducting signal path, said conducting signal path being electrically connected to said conducting interface at a corner thereof, said conducting interface being electrically connected to said input receiver, said signal path carrying said digital signal thereover, said conducting signal path having a length which is at least ⅙th of a transition electrical length of said digital signal carried thereover, said transition electrical length constituting a transient time of said digital signal multiplied by a propagation speed of said digital signal over said conducting signal path, and wherein said transient time of the said digital signal is selected from a group comprising a rise time thereof and a fall time thereof; and
   wherein said conducting interface is substantially rectangular in planar view and said conducting signal path connected thereto as aforesaid has a longitudinal centerline axis which forms an angle in a range of 110 to 160 degrees with respect to a side of said conducting interface to which said conducting signal path is connected to thereby produce a reduced reflection of said digital signal at said connection between said conducting interface and said conducting signal path when compared to a connection wherein said angle has a value of 90 degrees.

2. The apparatus according to claim 1, wherein said conducting signal path has a length which is at least said transition electrical length of said digital signal carried thereover.

3. The apparatus according to claim 1, wherein said angle in a range of 110 to 160 degrees is an angle of 135 degrees.

4. The apparatus according to claim 3, further comprising a circuit substrate, wherein said input receiver and said conducting interface are located on said circuit substrate.

5. The apparatus according to claim 4, wherein said circuit substrate comprises a printed circuit board and wherein said conducting interface is a pad and said conducting signal path is a trace.

6. The apparatus according to claim 5, wherein said pad is substantially square in planar view.

7. The apparatus according to claim 5, wherein said trace has a width which is ⅕th of a width of said pad to which said trace is connected.

8. The apparatus according to claim 5, wherein when said input receiver is mounted to said pad, said trace has a thickness which is in a range of ⅕th to ⅙th of a thickness of said pad to which said trace is connected.

9. The apparatus according to claim 5, wherein when said input receiver is mounted to said pad, said pad has a width of 22 mils and a thickness in a range of 6 mils to 7 mils, and wherein said trace has a width of 4 mils and a thickness of 1.2 mils.

10. The apparatus according to claim 5, wherein the apparatus is a memory system which further comprises a memory device, wherein said signal source is a memory controller which generates digital signals in the form of control signals carried by said trace, and wherein said input receiver is located within said memory device.

11. The apparatus according to claim 10, wherein said circuit substrate further comprises a slot and wherein said memory system further comprises a memory module on which said memory device is located, said memory module being a dual in-line memory module (DIMM) comprising an edge connector, said DIMM being connected to said memory controller by said edge connector connecting to said slot.

12. The circuit substrate for a signal-triggered digital circuit, said circuit substrate comprising:
   a conducting interface, substantially rectangular in planar view, for electrical connection to an input receiver, said input receiver receiving a digital signal over said digital circuit and being responsive to triggering induced by said digital signal;
   a conducting signal path having a width which is 1/5th of a width of said conducting interface, said conducting signal path being connected to said conducting interface, said signal path carrying said digital signal thereover, said conducting signal path having a thickness which is in a range of 1/5th to 1/6th of a thickness of the conducting interface to which said conducting signal path is connected; and
   wherein said conducting signal path connected to said conducting interface has a longitudinal centerline axis which forms an angle in a range of 110 to 160 degrees with respect to a side of the conducting interface to which said conducting signal path is connected to thereby produce a reduced reflection of said digital signal at said connection between said conducting interface and said conducting signal path when compared to a connection wherein said angle has a value of 90 degrees.

13. The circuit substrate according to claim 12, wherein said conducting interface is substantially square in planar view.

14. The circuit substrate according to claim 12, wherein when said input receiver is mounted to said conducting interface, said conducting interface has a width of 22 mils and a thickness in a range of 6 mils to 7 mils, and wherein said conducting signal path has a width of 4 mils and a thickness of 1.2 mils.

15. The circuit substrate according to claim 12, wherein said conducting signal path is connected to the conducting interface at a corner thereof.

16. The circuit substrate according to claim 15, wherein said conducting signal path has a length which is at least 1/6th of a transition electrical length of said digital signal carried thereover, said transition electrical length constituting a transient time of said digital signal multiplied by a propagation speed of said digital signal over said conducting signal path, and wherein said transient time of said digital signal is selected from a group comprising a rise time thereof and a fall time thereof.

17. The circuit substrate according to claim 16, wherein said conducting signal path has a length which is at least said transition electrical length of said digital signal carried thereover.

18. The circuit substrate according to claim 15, wherein said angle in a range of 110 to 160 degrees is an angle of 135 degrees.

19. The circuit substrate according to claim 18, wherein said circuit substrate comprises a printed circuit board, said conducting interface is a pad and said conducting signal path is a trace.

20. The circuit substrate according to claim 19, said circuit substrate further comprising an input receiver and a signal source for generating said digital signal.

21. The circuit substrate according to claim 20, said circuit substrate further comprising a memory device, wherein said signal source is a memory controller which generates digital signals in the form of control signals carried by said trace, and wherein said input receiver is located within said memory device.

22. The circuit substrate according to claim 21, wherein said circuit substrate further comprises a slot and wherein said memory system further comprises a memory module on which said memory device is located, said memory module being a dual in-line memory module (DIMM) comprising an edge connector, said DIMM being connected to said memory controller by said edge connector connecting to said slot.

23. The apparatus for a signal-triggered digital circuit of a memory system device, said apparatus comprising:
   a memory controller signal source for generating a digital control signal;
   an input receiver located within said memory device, said input receiver receiving said digital signal for said digital circuit and being responsive to triggering induced by said digital signal;
   a conducting inter face;
   a conducting signal path, said conducting signal path being electrically connected to said conducting interface at a corner thereof said conducting interface being electrically connected to said input receiver, said signal path carrying said digital signal thereover, said conducting signal path having a length which is at least $1/6^{th}$ of a transition electrical length of said digital signal carried thereover, said transition electrical length constituting a transient time of said digital signal multiplied by a propagation speed of said digital signal over said conducting signal path, said transient time of the said digital signal being selected from a group comprising a rise time thereof and a fall time thereof; and
   wherein said conducting interface is substantially rectangular in planar view and said conducting signal path connected thereto as aforesaid has a longitudinal centerline axis which forms an angle in a range of 110 to 160 degrees with respect to a side of said conducting interface to which said conducting signal path is connected to thereby produce a reduced reflection of said digital signal at said connection between said conducting interface and said conducting signal path when compared to a connection wherein said angle has a value of 90 degrees.

24. The apparatus according to claim 23, wherein said conducting signal path has a length which is at least said transition electrical length of said digital signal carried thereover.

25. The apparatus according to claim 23, wherein said angle in a range of 110 to 160 degrees is an angle of 135 degrees.

26. The apparatus according to claim 25, further comprising a circuit substrate, wherein said conducting interface and said conducting signal path are located on said circuit substrate.

27. The apparatus according to claim 26, wherein said circuit substrate comprises a printed circuit board and wherein said conducting interface is a pad and said conducting signal path is a trace.

28. The apparatus according to claim 27, wherein said pad is substantially square in planar view.

29. The apparatus according to claim 27, wherein said trace has a width which is ⅕th of a width of said pad to which said trace is connected.

30. The apparatus according to claim 27, wherein when said input receiver is mounted to said pad, said trace has a thickness which is in a range of ⅕th to ⅙th of a thickness of said pad to which said trace is connected.

31. The apparatus according to claim 27, wherein when said input receiver is mounted to said pad, said pad has a width of 22 mils and a thickness in a range of 6 mils to 7 mils, and wherein said trace has a width of 4 mils and a thickness of 1.2 mils.

32. The apparatus according to claim 26, wherein said circuit substrate further comprises a slot and wherein said memory system further comprises a memory module on which said memory device is located, said memory module being a dual in-tine memory module (DIMM) comprising an edge connector, said DIMM being connected to said memory controller by said edge connector connecting to said slot.

33. The circuit substrate for a signal-triggered memory device digital circuit, said circuit substrate comprising:
- a conducting interface, substantially rectangular in planar view, for electrical connection to an input receiver of the memory device, said input receiver receiving a digital control signal over said digital circuit and being responsive to triggering induced by said digital control signal;
- a conducting signal path having a width which is ⅕th of a width of said conducting interface, said conducting signal path being connected to said conducting interface, said signal path carrying said digital control signal thereover, said conducting signal path having a thickness which is in the range of ⅕$^{th}$ to ⅙$^{th}$ of a thickness of the conducting interface to which said conducting signal path is connected; and
- wherein said conducting path connected to said conducting interface has a longitudinal centerline axis which forms an angle in a range of 110 to 160 degrees with respect to a side of the conducting interface to which said path is connected to thereby produce a reduced reflection of said digital control signal at said connection between said conducting interface and said conducting path when compared to a connection wherein said angle has a value of 90 degrees.

34. The circuit substrate according to claim 33, wherein said conducting interface is substantially square in planar view.

35. The circuit substrate according to claim 33, wherein when said input receiver is mounted to said conducting interface, said conducting interface has a width of 22 mills and a thickness in a range of 6 mils to 7 mils, and wherein said conducting signal path has a width of 4 mils and a thickness of 1.2 mils.

36. The circuit substrate according to claim 33, wherein said conducting signal path is connected to the conducting interface at a corner thereof.

37. The circuit substrate according to claim 36, wherein said conducting signal path has a length which is at least ⅙th of a transition electrical length of said digital signal carried thereover, said transition electrical length constituting a transient time of said digital signal multiplied by a propagation speed of said digital signal over said conducting signal path, and wherein said transient time of said digital signal is selected from a group comprising a rise time thereof and a fall time thereof.

38. The circuit substrate according to claim 37, wherein said conducting signal path has a length which is at least said transition electrical length of said digital signal carried thereover.

39. The circuit substrate according to claim 36, wherein said angle in a range of 110 to 160 degrees is an angle of 135 degrees.

40. The circuit substrate according to claim 39, wherein said circuit substrate comprises a printed circuit board, said conducting interface is a pad and said conducting signal path is a trace.

41. The circuit substrate according to claim 40, said circuit substrate further comprising a signal source for generating said digital control signal.

42. The circuit substrate according to claim 41, wherein said circuit substrate further comprises a slot and wherein said memory device farther comprises a memory module on which said memory device is located, said memory module being a dual in-line memory module (DIMM) comprising an edge connector, said DIMM being connected to said memory device by said edge connector connecting to said slot.

* * * * *